United States Patent [19]

Learned

[11] Patent Number: 5,075,642
[45] Date of Patent: Dec. 24, 1991

[54] OSCILLATOR CIRCUIT

[75] Inventor: Edward B. Learned, Fort Branch, Ind.

[73] Assignee: Potter & Brumfield, Inc., Princeton, Ind.

[21] Appl. No.: 565,545

[22] Filed: Aug. 10, 1990

[51] Int. Cl.⁵ .............................................. H03K 3/23
[52] U.S. Cl. .................................. 331/143; 331/177 R
[58] Field of Search ..................... 331/111, 143, 177 R

[56] References Cited
U.S. PATENT DOCUMENTS 3,689,807 9/1972 Tenenbaum ..................... 317/141 S
4,623,851 11/1986 Abou ................................... 331/111

Primary Examiner—David Mis
Attorney, Agent, or Firm—Jeffrey P. Morris

[57] ABSTRACT

An adjustable frequency oscillator has an adjustable element, such as a potentiometer, for setting the frequency of oscillation. The circuitry in the oscillator is such that the frequency of oscillation is relatively immune to the characteristics of the adjustable element. The oscillator may be used in a time delay circuit, notably, in a time delay circuit used to control a time delay relay.

16 Claims, 19 Drawing Sheets

IC1 PIN 1
REFERENCE IS IC1 PIN 8

IC2 PIN 3
REFERENCE IS IC1 PIN 8

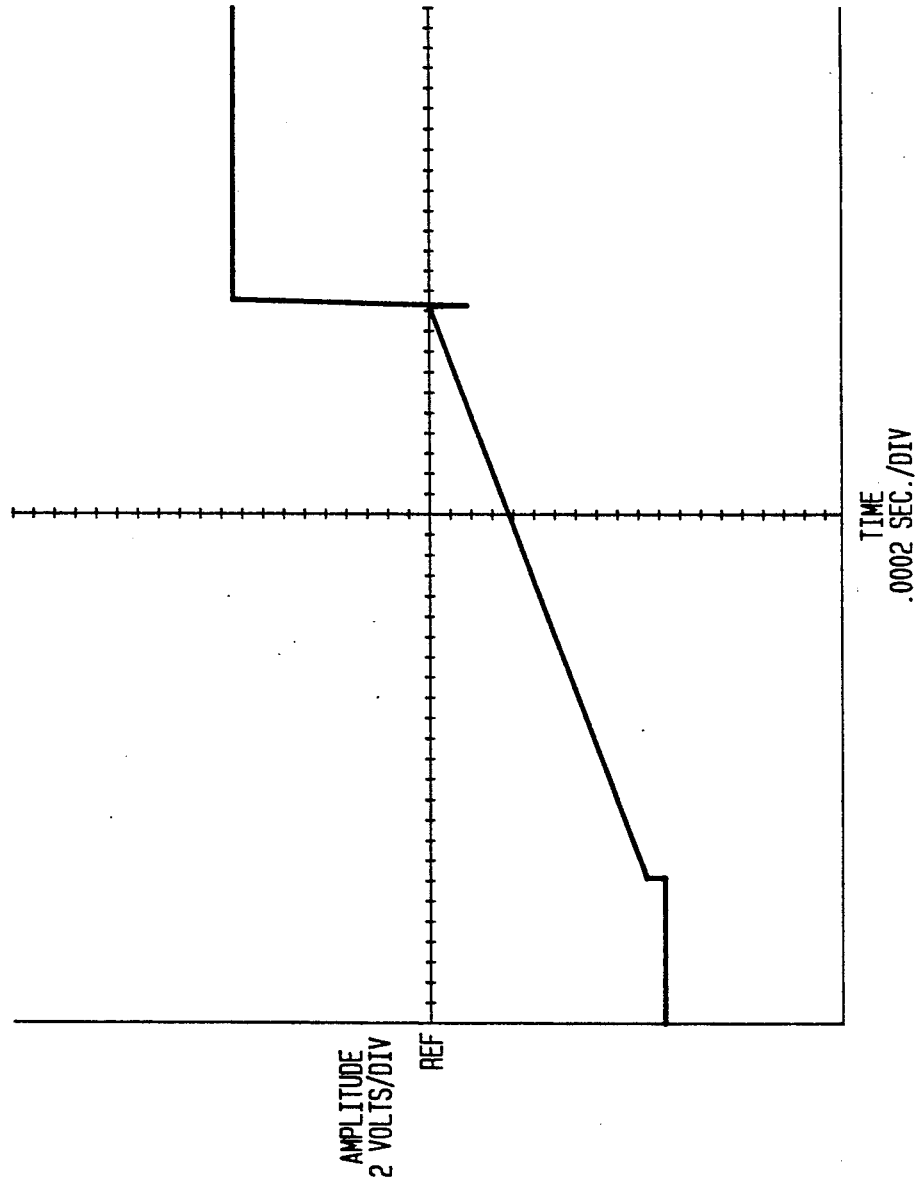

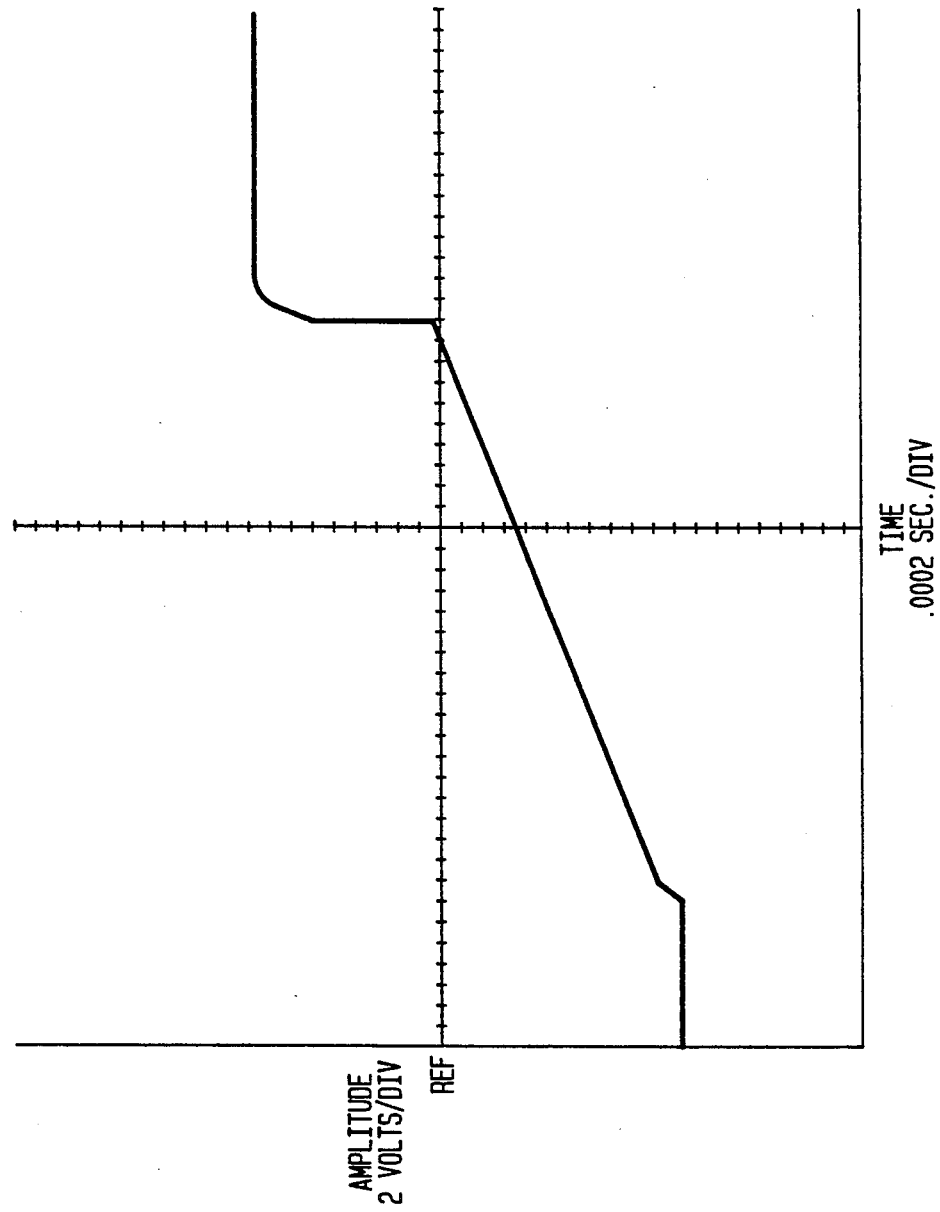

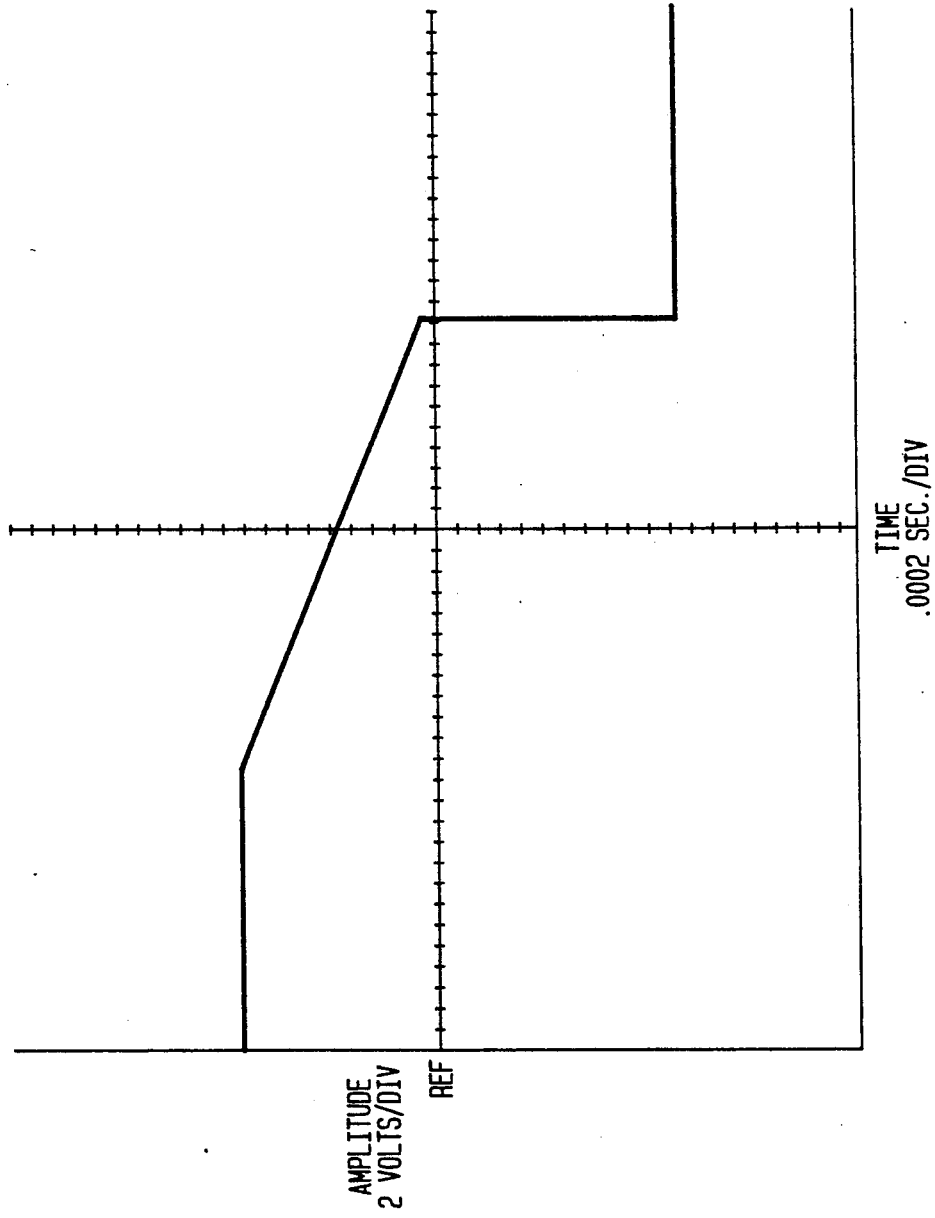

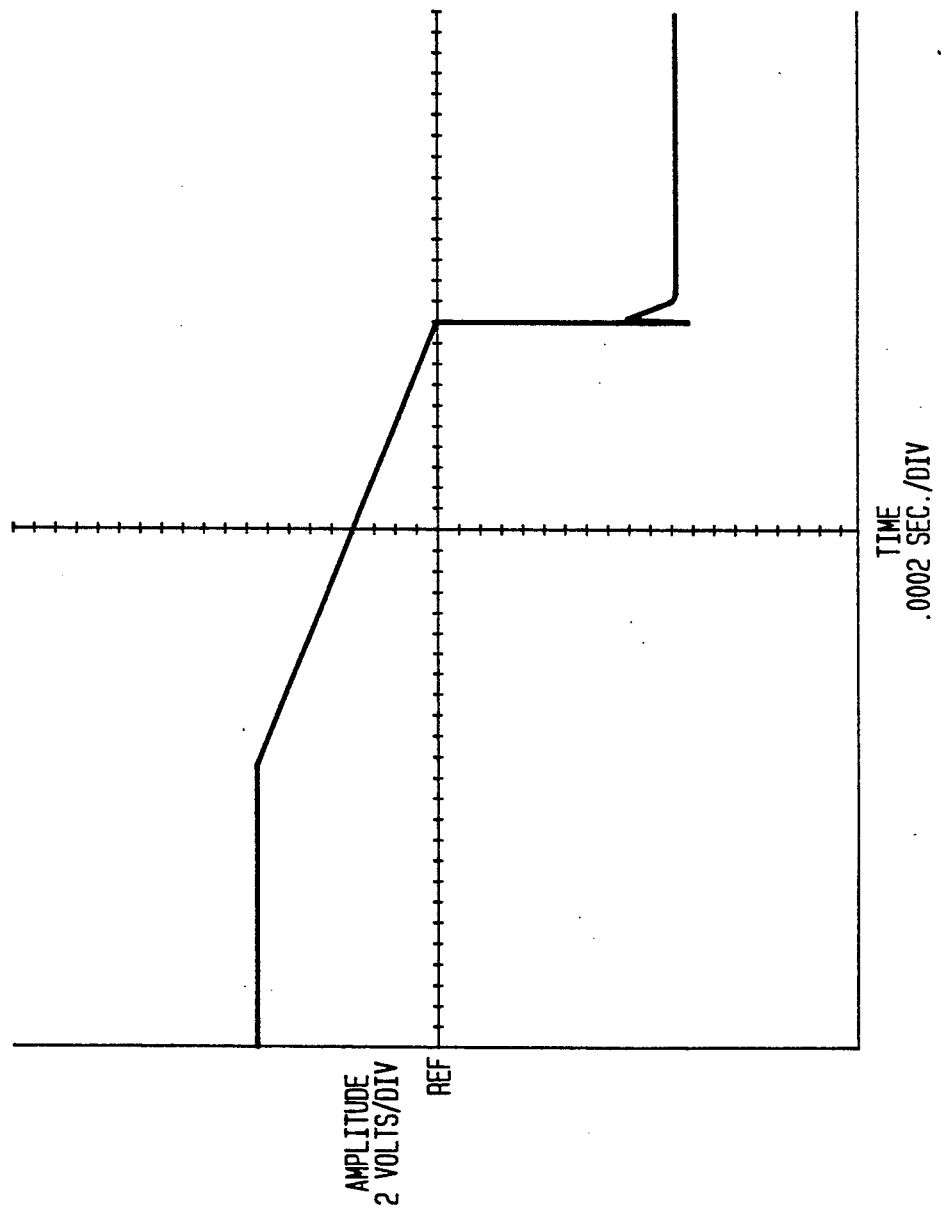

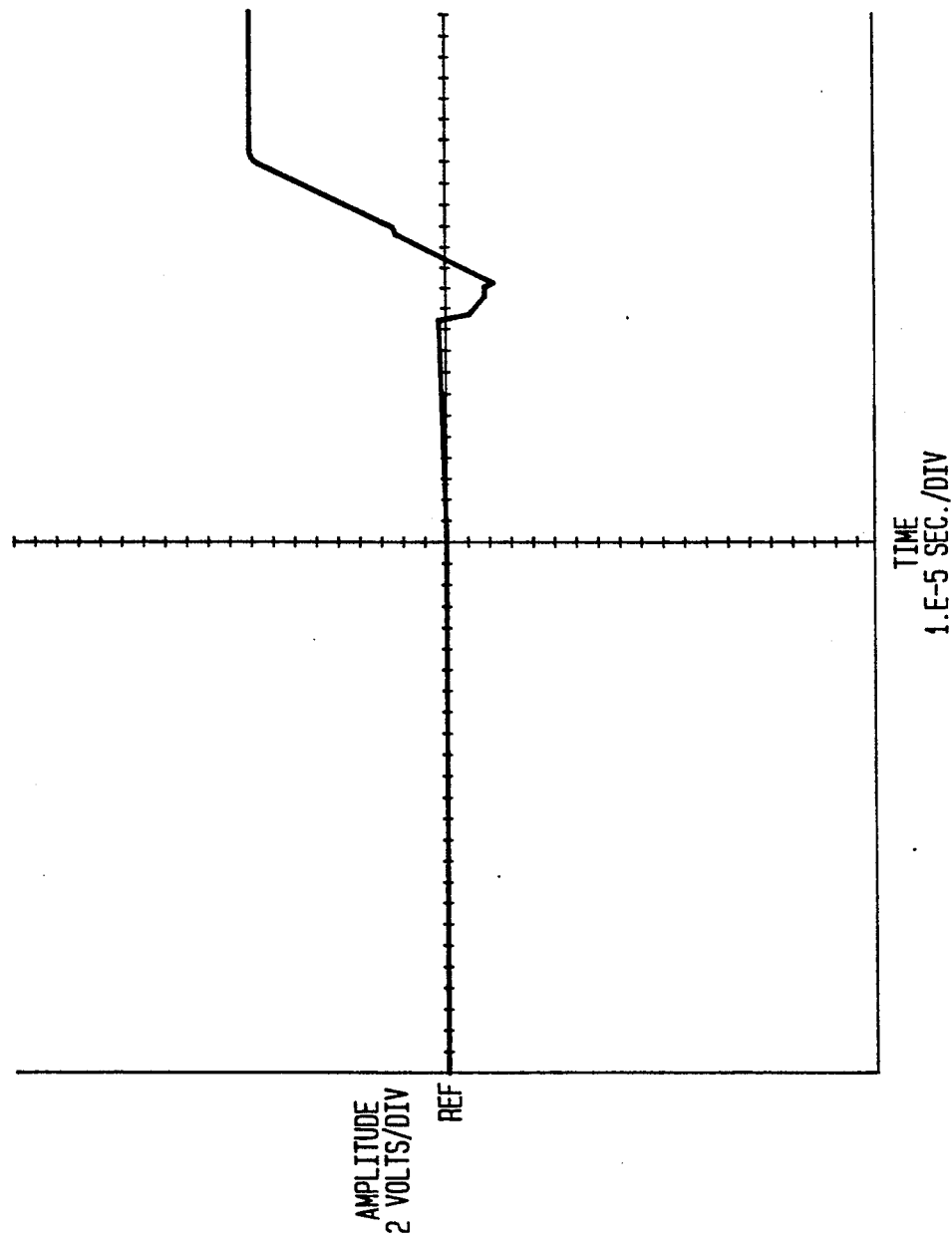

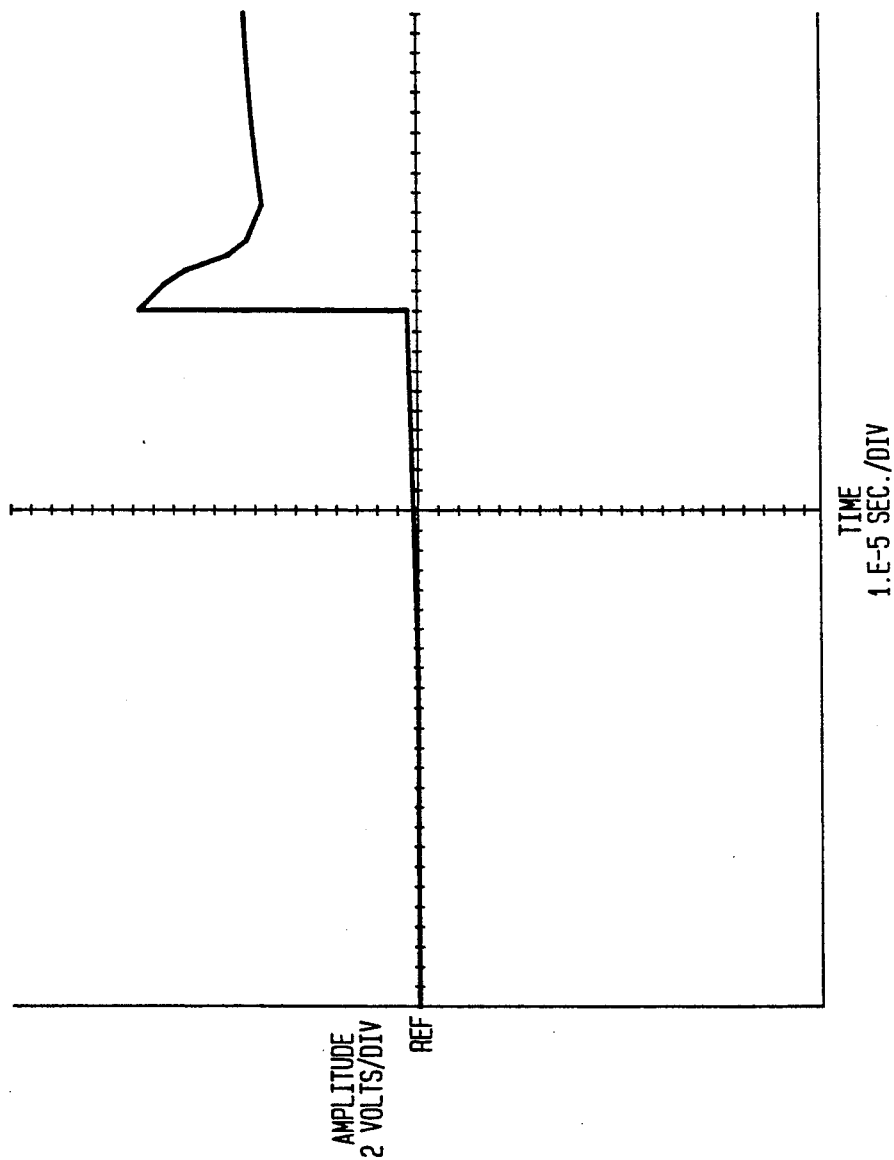

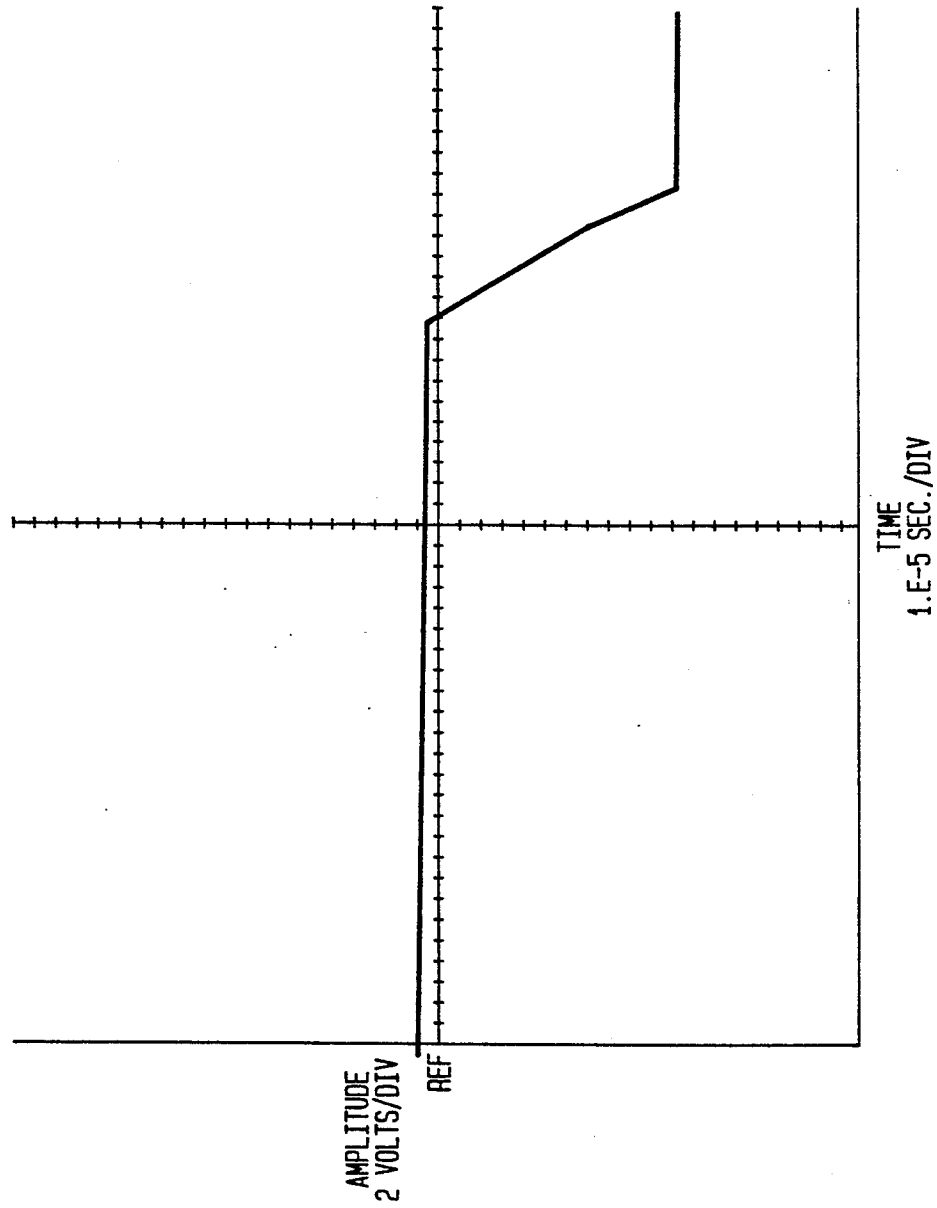

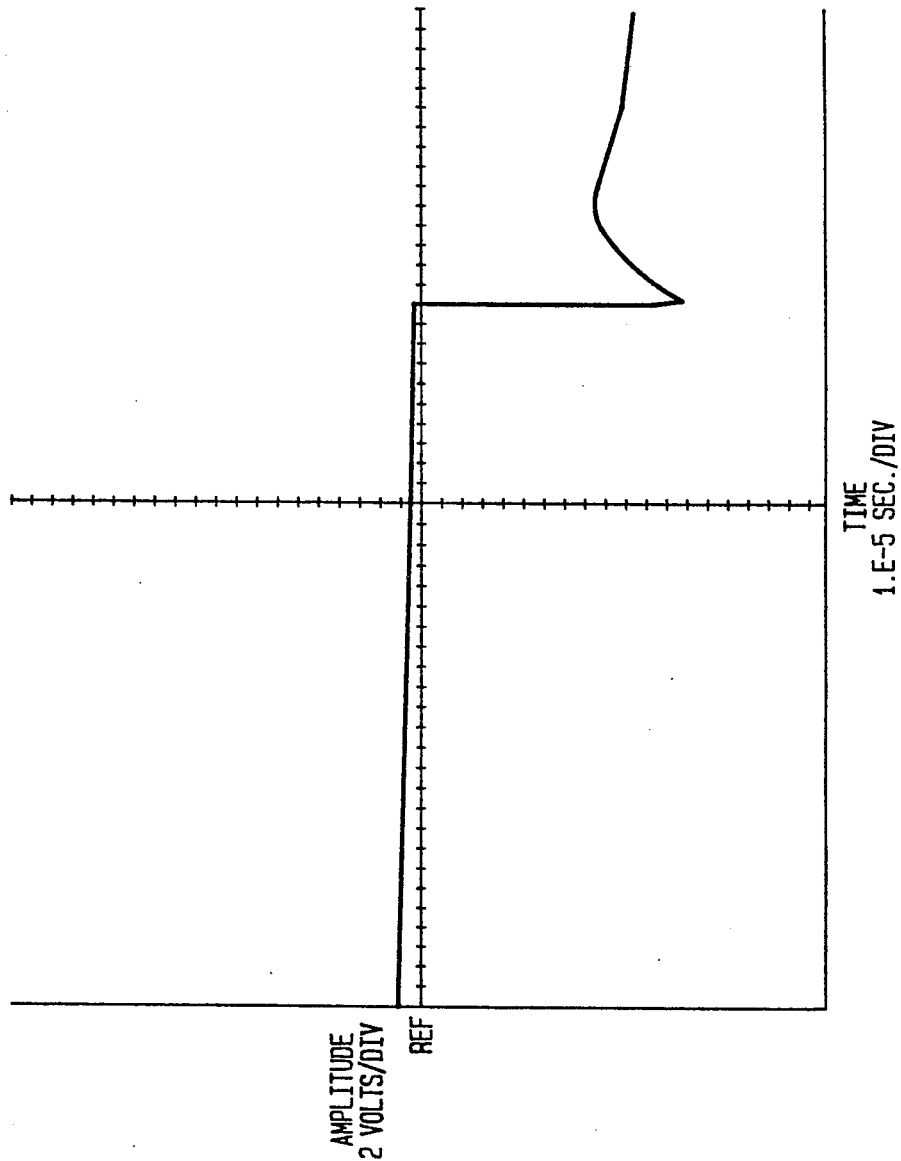

OSCILLATOR CIRCUIT

BACKGROUND OF THE INVENTION

This invention relates to oscillator circuits. More specifically, this invention relates to adjustable frequency oscillator circuits having an adjustable element for conveniently setting the frequency of the oscillator. One aspect of the invention is an adjustable frequency oscillator circuit, the output frequency of which is relatively immune to variations in the characteristics of the frequency setting element.

This invention also relates to an adjustable time delay circuit which may include a voltage controlled oscillator circuit for actuating a counter chain which counts a pre-selected number of oscillator cycles and produces an output change of state after the counter chain has filled up. More particularly, the invention relates to a time delay circuit for use in a time delay relay.

Time delay relays have many uses. All such uses involve the same type of function, i.e., a controlled operation occurs a predetermined period of time after a controlling operation Adjustable time delay circuits are well-known in the art. Those circuits use a potentiometer for adjusting the delay period. In most classic adjustable timer circuits, the potentiometer is a resistance element in an "RC" circuit. The time delay circuit may be an oscillator based circuit, such as a classic CMOS oscillator, or a single charge event circuit, such as a unijunction transistor (UJT) based or programmable unijunction transistor (PUT) based circuit A PUT time delay relay, for example, is described in U.S. Pat. No. 3,689,807. These known circuits generally use the potentiometer as a two-terminal connected variable resistor, or possibly connect the wiper to one end of the potentiometer either directly or through another fixed resistor. Connecting a resistor from the wiper to one end of the potentiometer has the additional and usually undesirable effect of introducing a non-linearity into the potentiometer "rotation versus resistance" relationship. In any case, the effect is the same: the potentiometer remains the "R" in an "RC" based time delay circuit, and therefore any change in the potentiometer resistance value produces a corresponding change in the time constant or oscillator period.

In a classic CMOS oscillator, a potentiometer is used for adjusting the oscillator frequency. However, the low cost potentiometers usable for mass production of time delay relays have significant impedance tolerances. A typical potentiometer has a tolerance of plus or minus 20–30% "out of the box", and then any environmentally induced changes are in addition to that. If the potentiometer, as mentioned above, is used as a two-terminal connected variable resistor in a timing circuit for adjusting the oscillator period, any drift or tolerance shift in the potentiometer impedance value has a directly proportional effect on the oscillator period, and in order to be sure that each finished assembly is within its advertised tolerance band (for maximum time adjustment specifications), each potentiometer has to be matched within appropriate capacitor value, or electrically paralleled with a resistor of an appropriate size. This situation mandates grading and selection procedures in order to match the appropriate components for a given oscillator period, which would result in a given "time out" period.

While those grading and selection processes are undesirable in all methods of manufacturing time delay relays, these steps are totally impractical when using surface mounted components for the assemblies because those components are normally handled by automated equipment, with which component selection processes are either not possible or at least not very practical.

SUMMARY OF THE INVENTION

One objective of the invention is to be able to mass produce a potentiometer-adjustable time delay circuit, and in particular, time delay relay assemblies which would meet all present electrical specifications for these product families, including tolerances, but produce them at a reduced total cost, and at the same time eliminate all component selection and grading of the potentiometer.

The invention contemplates a time delay circuit using a commercially available "timer IC" which incorporates a counter chain to count oscillator cycles and produce an output after the counter chain fills up. For example, such a timer IC is a 4541 type timer IC available from Motorola under the number MC14541B or a Potter & Brumfield timer IC, numbers 600N0065 or 600N0135, which are used in Potter & Brumfield's CNS-35-76 programmable time delay and similar products, for example. Any equivalent timer IC can also be used for purposes of the invention.

In accordance with one specific example of the invention, the oscillator circuit comprises:
an input;
first and second outputs swinging to positive and negative amplitudes of a given supply voltage with respect to a ground signal, the second output signal being the inverse of the first output signal;
a voltage divider made up of at least a potentiometer and a fixed series resistor, the potentiometer end of the voltage divider being connected to a reference voltage corresponding to said first oscillator output voltage and the resistor end of the voltage divider being connected to said signal ground, a wiper of said potentiometer providing a target voltage corresponding to the actual electrical position of a wiper in the voltage divider;
an integrator stage integrating said second output signal to provide a ramp voltage signal; and
a comparator stage, said target voltage and said ramp voltage signal being fed to the inverting and non-inverting inputs, respectively, of said comparator stage, the output of the comparator stage delivering a transition signal to said oscillator input when the ramp voltage has a predetermined relationship with respect to said target voltage, resulting in reversal of the logic states of the first and second oscillator outputs.

In accordance with this invention, the potentiometer is used as a terminal voltage divider element. As such, it produces a variable voltage reference, relatively independent of variations in total resistance, provided that the terminal voltages of the potentiometer are controlled. In this case, regardless of the resistance value of the potentiometer, the voltages appearing at the end points of the potentiometer set up a voltage gradient across the resistance element of the potentiometer. The linearity of this voltage gradient versus potentiometer rotational position is still a function of the absolute linearity of the potentiometer. Under unloaded conditions, the wiper is at a potential which never exceeds either endpoint voltage. This then provides the target voltage for the voltage controlled oscillator. Controlling the endpoint voltages on the potentiometer will also put definite electrical limits at both extremes of the potentiometer adjustment range.

BRIEF DESCRIPTION OF THE DRAWINGS

In the drawings, wherein like reference characters corresponding parts in several circuits:

FIGS. 4 to 19 are oscillograms showing voltages at various places in the circuit of FIG. 1.

DESCRIPTION OF THE PREFERRED EMBODIMENTS

Figure 1:
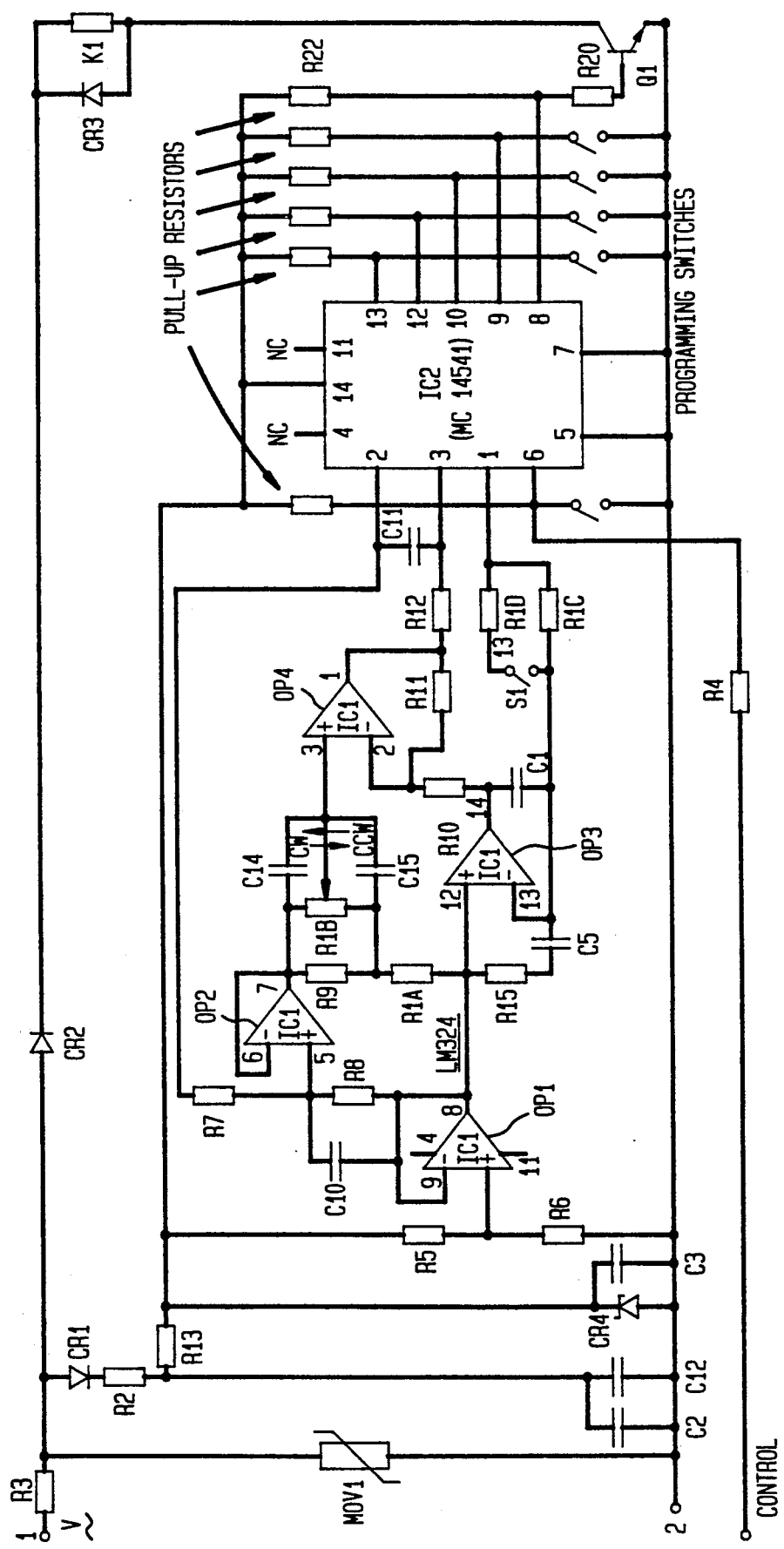
FIG. 1 is a schematic diagram of a time delay relay circuit including an adjustable oscillator according to the invention.

The description of FIG. 1 below should be read in conjunction with a study of FIGS. 4-19 which are believed to be self explanatory. In FIG. 1, a time delay relay circuit is shown for energizing a relay coil K1 in pre-set time periods. CR3 is a discharging diode, connected across the coil K1. MOV1 is a conventional overvoltage protection device. The relay coil K1 is connected in series with diode CR2, and its energizing path is switched on and off by a transistor Q1 in accordance with the logic state of output node 8 of a timer IC, designated as IC2 in FIG. 1, which may be the designated Motorola device. Transistor Q1 may be on SCR, or if K1 were an AC relay coil, Q1 could be a triac. When Q1 is a triac, CR2 and CR3 would not be used. capacitors C2 and C12. Capacitors C2 and C12 are power supply storage filter capacitors. R13 then feeds zener diode CR4, which provides a regulated voltage source for the logic level circuitry. C3 is a small "noise" filter. Output pin 8 of the timer IC is generally either at a logic zero or a logic one. Since the base of the output transistor Q1 is at virtual ground (at only 0.6 volts, nominal), essentially the same power supply current is drawn from pin 8 in either logic state, because there is supply voltage across either R20 or R22. This was intended in order to equalize the discharge time of the power supply, regardless of the output logic state of the timer IC2. This is in order to balance the recycle time, which is essentially the minimum amount of time that input power must be removed in order to guarantee an automatic reset upon re-application of power. The automatic reset is internally generated by the timer IC2, based on the instantaneous power supply voltage V.

In the circuit according to the invention, much of the oscillator circuit has been outboarded from the timer IC2. As initially mentioned, this timer integrated circuit IC2 may be a commercially available IC, for example MC14541B or 600N0065 or any other timer IC having equivalent or similar properties. The different pins of the IC have to be connected in accordance with the functions as described below, while the numbering of the pins may be different. The output pins 1 and 2 and the input pin 3 of IC2 serve as the logic for the oscillator, but the analog portions (except for the threshold detection) have been outboarded from the timer IC2. For example, they may be in the form of a quadruple operational amplifier ("quad op-amp") integrated circuit IC1 which may be an LM 324 quad op-amp. In FIG. 1, pins 6, 9, 10, 12, and 13 of IC2 may be connected selectively either to the positive or negative power supply in order to pre-select a time characteristic.

A voltage divider made up of R5 and R6 serves to provide a voltage equal to approximately to ½ of the power supply to the input of the voltage follower op-amp OP1. The output of this op-amp OP1 then provides the same voltage out, only buffered to a much lower output impedance. This output of op-amp OP1 can now be thought of as "signal ground" or a ground voltage for the rest of the op-amp circuitry. Referenced to this signal ground, the operational amplifiers have both a positive and a negative power supply voltage, which are applied to pins 4 and 11, respectively, the power supply connections to this IC.

Output pin 2 of the timer IC2 is connected to one end of a voltage divider which is made up of resistors R7 and R8. The other end of the voltage divider is connected to the signal ground (output of OP1). The connecting point of R7 and R8 is tied to the non-inverting input of a second voltage follower OP2. A further voltage divider, made up of a parallel connection of a potentiometer R1B and a parallel resistor R9 and a series resistor R1A is tied across the output of OP2 and signal ground. The wiper of the potentiometer R1B is connected to the non-inverting input of an operational amplifier OP4 which serves as a differential comparator.

Pin 1 of the timer IC2, is connected to an integrator stage including a timer resistor R1C and a timer capacitor Cl, forming a RC-circuit connecting pin 1 of the IC to the output of an operational amplifier OP3. This output is connected through a series resistor R10 to the inverting input of the comparator OP4. The output of OP4 is connected to the inverting input of OP4 through a feed-back resistor R11 and to the input pin 3 of the timer IC through a series resistor R12. As shown in FIG. 1, a parallel resistor R1D can be provided in parallel to R1C and optionally, with switch S1 closed, form a parallel combination of R1C and R1D. For example, R1C may be an external resistance element. Pin 6 of IC2 may be driven to logic 1 or 0 in accordance with the IC characteristics, for providing a control or reset function.

Both pins 1 and 2 of the timer IC2, swing to the extreme limits of the power supply voltages. The voltages are thus essentially square waves alternating between the voltage levels defined by the power supply rails connected to the timer IC2. The voltage at pin 1 is the inverse of the voltage at pin 2. Assuming a square wave of this amplitude at pin 2 of IC2, then a square wave of reduced amplitude and almost identical timing will be observed at the inverting input of the other voltage follower op-amp OP2 in FIG. 1. The relative values of R7 and R8 dictate the peak-to-peak amplitude of the signal at the output of this voltage follower stage OP2. The signal at pin 7 (output) of OP2 should be identical to the signal on pin 6 (inverting input), in peak-to-peak voltage, but the rise times and fall times will be somewhat slower because of the op-amp's slew rate limitations. Since this point also ties to the clockwise end of the potentiometer, then the output voltage at the wiper of the potentiometer with the potentiometer turned fully clockwise is independent of the potentiometer impedance value, assuming there are no significant loading factors to alter the voltages.

The value of R9, which is in parallel with the potentiometer, may be much smaller in ohmic value than the potentiometer itself and is also of a much smaller tolerance than the potentiometer itself. Therefore, the voltage divider made up of R9 in parallel with the potentiometer R1B, in series with R1A, is not significantly affected by the value of the potentiometer, so potentiometer tolerances and potentiometer drift induced by environmental factors are of little or no concern. The relative values of the voltage divider made up of the resistors R9, R1B and R1A determine the amplitude of the square wave at the counterclockwise end of the potentiometer, which is connected to the junction of R9 and R1A. Therefore, the value of R1A determines the minimum target voltage (and therefore the highest frequency, which is the shortest time period) for this voltage controlled oscillator circuit. Since the input to the non-inverting amplifier (which is the op-amp OP4) represents a high impedance, then the ratio of minimum-to-maximum voltage amplitude of the square wave available from the wiper of pot R1B becomes a function of the ratio of the ohmic values of R1A and the parallel combination of R9 and R1B.

Signal ground at the output of OP1 (pin 8) is the reference voltage for the integrator stage. The actual integrator is made up of C1 and R1C, or, (with switch S1 closed), the parallel combination of R1C and R1D. There is a "triangle wave" at the output of this integrator stage, which is at the output of OP4, pin 14 of the quad op-amp. This waveform has a constant slope, but its amplitude (and therefore the oscillator frequency) is controlled by the "target voltage", which is the voltage at the wiper of R1B. That voltage is determined by the rotational position of the pot. Since the triangle waveform (at the output of the integrator stage) is a constant slope, (which is varied only by switching R1D in or out of the circuit), it represents a constant current charging (or discharging) the timing capacitor, which means it also acts as a constant load on the power supply, relieving some constraints on the power supply design.

The gain of the differential operational amplifier stage OP4 is intentionally limited because the operational amplifiers have a finite slew rate capability, and since the slope at the output of the integrator is essentially multiplied by the gain of this stage, the final slew rate must be within the operational amplifier's actual slew capabilities, or timing errors will result. The output of this amplified stage is sensed by the input pin 3 of IC2, so the actual amplitude of that signal is a suitable CMOS logic level suitable for input pin 3. This fact dictates the minimum gain of the differential amplifier stage OP4, with the slew rate rating of the operational amplifier constraining the maximum gain. The resistor R12 from the output of the differential amplifier (OP4, pin 1) to the timer IC input, pin 3 serves only to develop a slight hysteresis "step voltage" which is coupled by capacitor C11 (e.g. 22 pF) (as positive feedback) from pin 2 to pin 3 of IC2 at the instant of logic transition. This capacitor (e.g. 22 pF) is used to assure that one (and only one) transition is sensed at pin 3 of IC2 in each direction (rising edge and falling edge) per full oscillator cycle of the triangle wave at the output of OP3 (pin 14). In the absence of capacitor C11, the slow transitions through the "threshold" on pin 3 of the timer IC can cause this IC to internally oscillate, producing multiple clock cycles per oscillator cycle. C11 feeds a very sharp pulse to pin 3 of the timer IC, at the instant that the voltage at pin 3 crosses the CMOS threshold. This overcomes the "slow reaction time" of the op-amp stages, and the time constant of C11 and R12 allows the op-amp to "catch up" after the instantaneous transition.

Other optional components in the schematic of FIG. 1 are capacitors C10, C14 and C15. The function of capacitor C10 (e.g. a 0.0033 uF capacitor) is to compensate for slight timing errors introduced at the highest oscillator frequencies by capacitor C11. The effect of C10 is to slow down the rate of change at the non-inverting input of OP2. By appropriately sizing R7 and R8 (for the proper source impedance), the effect is that, when R1B is adjusted for maximum oscillator frequency (with the wiper essentially connected to the junction of R1A and R9), the "target voltage" for the triangle wave is reduced in amplitude, which tends to raise the oscillator frequency, counter-acting slight undesirable effects of C11. At the lower frequencies, capacitor C10 has no effect because its voltage stabilizes completely before the next switch transition on every half-cycle of the triangle wave. The result under those conditions is that capacitors C10 and C11 have virtually no effect on circuit operation, other than to prevent electrical noise from affecting the oscillator circuit, via transients.

Capacitors C14 and C15 are high frequency bypass capacitors, (e.g. 47 pF each). The reason for using these capacitors is to make the oscillator more immune to "electrical noise", at all points of adjustment. When R1B, in a situation where it is a "linear pot", is adjusted to its electrical center, the source impedance at the wiper is essentially ¼ the pot value (R1B). That can cause the oscillator to be sensitive to ambient electrical noise, in the absence of capacitors C14 and C15. The transient source impedance is much lower at the wiper of R1B with the addition of C14 and C15. These components do not otherwise enter into the operation of the oscillator.

Since the circuit in this example of the invention uses a counter-chain based timer IC, such as IC2 as one of the principal components in the assembly, and those invariably use an oscillator to produce the pulses which end up getting counted by a counter chain, there are complementary logic states available from that IC at all times of interest. However, since the timing is produced by an RC timing circuit (C1, R1C), whatever charge was added to the capacitor C1 during one half cycle of the oscillator must be taken back out in the next half cycle. That in itself dictated the necessity of a negative rail on the internal power supply, especially if the controlling element is to be an operational amplifier configured as an integrator (OP3). In other words, the power supply rails have to be both positive and negative with respect to the integrator reference node, which is the non-inverting input to the integrator operational amplifier OP3.

Since the potentiometer R1B is to produce a voltage reference, then a voltage comparing device is required to compare instantaneous charge on the capacitor C1 with the voltage reference at the pot wiper of R1B Thus, to produce a varying oscillator frequency, a constant resistance (fixed timing resistor) fed by a constant amplitude square wave (in this example of the invention, a CMOS node swinging from one power supply rail to the other power supply rail) connected to the fixed value capacitor C1, with variable amplitude detection and resulting reversal of logic states, instantaneously relative to the oscillator period, will accomplish the desired goals. The integrator output peak-to-peak voltage varies as a function of the target voltage which, in turn, varies as a function of the potentiometer adjustment. Because $I/C = dv/dt$, for a constant charging current I, which is normal in any integrator, and a constant capacitance C, dt (delta time) is in direct proportion to dv (delta voltage).

Because amplitude detection is required, and the IC has to switch (reverse logic states) as a result of that detection, operational amplifier stage OP4 was configured as a differential amplifier to compare (with limited gain) the target voltage (produced at the potentiometer wiper) with the integrator output voltage. Some gain in this stage is needed because at the lower settings of R1B, the signal amplitude out of the wiper of R1B can be quite low, depending on the relative values of the resistor divider networks in the circuit. The amplification is needed to raise the signal-to-noise ratio of the signal delivered to pin 3 of the timer IC2. However, the gain of this stage is intentionally limited in order to avoid phase errors: that is, the output of this stage OP4 should cross the threshold of the CMOS IC (which is semi-constant at approximately one half of the supply voltage( at the same time that its two inputs (inverting and non-inverting) are equal. If the gain of this stage were not limited, the operational amplifier OP4 would just begin to slew toward the threshold at the time of interest, inducing an error equal to the actual slew time to the threshold for each and every half-cycle of oscillation. This could become an unacceptable total error because it is a cumulative error.

Because the output of the integrator stage OP3 exhibits a constant slope, the differential amplifier stage will amplify that slope unless that amplification would put the resultant instantaneous voltage outside of that stage's own output swing capabilities, in which case the operational amplifier OP4 will swing as close as possible to its own power supply rail, either the negative supply rail or the positive supply rail, depending on which node (inverting or non-inverting) has a higher voltage on it.

Because of that slope amplification, the slew rate capability of the differential-stage op-amp has to be such that the actual dv/dt slope delivered by that stage will not ever exceed the slew rate rating of the operational amplifier being used, or phase errors (and timing errors) will result.

Assuming a constant slop out of the integrator (dictated by the constant resistance R1C and a constant capacitance C1) there is a constant absolute magnitude voltage across the timing resistor feeding the integrator providing R5 and R6 are equal. That means that the power supply current demanded by this oscillator circuit is also constant, (except for instantaneous switching transients which occur at the actual switching times), unlike the classic CMOS circuit, where the capacitor must charge to a constant voltage in a variable amount of time, which dictates a variable charging resistance or impedance. The constant current load is another advantage of this circuit over the conventional CMOS oscillator. Some time delay assemblies are designed to have as much as a 180 : 1 or higher adjustment range. Those ranges get to be quite difficult to handle, when powering the circuit from a relatively high impedance, half-wave power supply, especially when the actual power dissipation which can be tolerated in an enclosed plastic case is quite low.

Another advantage of this circuit is that symmetrical errors tend to cancel. For instance, if the two resistors which form the voltage divider for the reference voltage (R5 and R6 in FIG. 1) were five percent resistors of equal value, but they were at opposite extremes of their tolerances, the reference voltage would be in error by a full 5%, but the end result is that the oscillator period would be in error by only 0.25%. The reason for this is that the currents charging and discharging the capacitor C1 would be increased during one half-cycle and decreased during the next half-cycle, tending to balance out the difference in times. The same scenario holds true for input bias currents and input offset voltages. Additionally, normal variations from chip to chip on the input threshold of the sense node of the timer IC (which is pin 3 of IC2 in FIG. 1) will make no difference in total oscillator period.

As shown in FIG. 1, an RC network R15 and C5 is connected in series across the two inputs of the integrator stage OP3 as an option. This provides another advantage to this circuit. Normally, the operational amplifier OP3 forces these two nodes to be within the input offset voltage specification of each other, as is the case when an operational amplifier is configured as a voltage follower. In any integrator, there is normally no differential dv/dt voltage between the two nodes. The operational amplifier normally slews its output at a rate which causes the inverting input of the operational amplifier to remain equal to its non-inverting input. However, the operational amplifier OP3 has a limited slew rate, so it cannot force the inverting input to follow the non-inverting input under some transient conditions. Also, at these high frequencies (noise contains high frequency components), the operational amplifier will demonstrate phase errors, which essentially show up as a delayed reaction time. If these high frequency components can be introduced simultaneously and at the same amplitude on both input nodes, most of these errors can be avoided.

The RC network, R15 and C5, insures that, by forcing most noise-induced signals to become common mode, and thereby rejected by the operational amplifiers "common mode rejection ratio" factor. The resistor R15 is a very low value, to allow maximum transfer of AC signals between the two input nodes of the operational amplifier OP3. The only intended function of this resistor R15 is to prevent parasitic oscillations.

It can readily be seen that while the potentiometer R1B controls the oscillator frequency in this circuit, its value does not enter into the equations which dictate the timing capacitor charge and discharge currents. It only provides a target voltage which the integrator output must match (actually, exceed slightly, due to the voltage divider action of the gain-determining resistors at the non-inverting differential amplifier stage OP4). Because the potentiometer impedance does not determine the charge currents for the capacitor C1, the actual value of the potentiometer is irrelevant, except for power supply constraints. This means that the same ohmic value of the potentiometer can be used for any time delay assembly, regardless of the time, time range, or minimum-to-maximum time ratio. Additionally, by paralleling the potentiometer with a much lower value and lower tolerance resistor R9 than the potentiometer is rated, tolerance variations in the potentiometer itself can be virtually washed out. Therefore, no selection procedures are required to meet very low tolerances. The potentiometer and the two resistors R9 and R1A connected to it control only the minimum-to-maximum time adjustment ratio. They do not determine the actual time. The RC (R1C and C1) forming the integrator circuit determines only the dv/dt rate of charge and discharge of the capacitor. It is not affected by the values of the potentiometer or its associated resistors.

The maximum target voltage available from the potentiometer (at the clockwise extreme of rotation) is not affected by the potentiometer value, or the value of either of the two resistors connected to it. That maximum target voltage is only affected by the two voltage divider resistors (R7 and R8) connected to the non-inverting node of the voltage follower operational amplifier (OP2) which is driving the clockwise end of the potentiometer. The minimum target voltage is affected by these resistors as well, but also controlled by the resistor R1A in series with the potentiometer R1B, as well as by the potentiometer's shunt resistor R9. By electrically isolating most of the effects of individual part tolerances, tolerance buildup is substantially reduced, making nominal design targets much closer to the average real result. This is a great help to manufacturing, and nearly essential for any close tolerance, automatically assembled apparatus, such as SMD based (surface mounted device) time delay assemblies. The surface mounted assemblies are a case-in-point, where component selections and grading are not practical, due to the highly automated nature of the assembly. It is not practical for the machine operators to intervene and substitute different values for each assembly, in order to adjust each unit into specifications.

Below is a parts list which is useful in constructing a specific circuit in accordance with FIG. 1:

| TYPICAL "FIG. 1" PARTS LIST | | | |
|---|---|---|---|
| RESISTORS | | CAPACITORS | |
| R1A | 1.78K ohms, 1% | C1 | 0.1 uF, 5% |
| R1B | 1.5M ohms, 20% | C2 | 2.2 uF, 20% |
| R1C | 301K ohms, 1% | C3 | 0.1 uF, 20% |
| R1D | 33.2K ohms, 1% | C5 | 0.1 uF, 10% |
| R2 | 6.2K ohms, 5% | C10 | .0033 uF, 5% |
| R3 | 15 ohms, 5% | C11 | 22 pF, 10 |
| R4 | 30K ohms, 5% | C12 | 2.2 uF, 20% |
| R5 | 61.9K ohms, 1% | C14 | 47 pF, 20% |
| R6 | 71.5K ohms, 1% | C15 | 47 pF, 20% |
| R7 | 61.9K ohms, 1% | SEMICONDUCTORS | |
| R8 | 14.7K ohms, 1% | CR1 | 1000V, 1A Rectifier |
| R9 | 20K ohms, 1% | CR2 | 1000V, 1A Rectifier |
| R10 | 61.9K ohms, 1% | CR3 | 1000V, 1A Rectifier |
| R11 | 1.62M ohms, 1% | CR4 | 12V, 5% Zener Diode |
| R12 | 330K ohms, 5% | Q1 | 300V NPN Transistor |
| R13 | 3.9K ohms, 5% | | (MOT type MPS-A42) |
| R15 | 100 ohms, 5% | IC1 | Low power Quad op-amp |
| R20 | 12K ohms, 5% | | (LM 324, typical) |
| R22 | 12K ohms, 5% | IC2 | Motorola MC14541 or |
| Pull-up Resistors | | | equivalent "timer IC" |
| 110K ohms, 5%, typical | | MOV1 | Metal Oxide Varistor |
| Relay | | | GE P/N V300LAX925 |
| K1 - Potter & Brumfield | | | |
| P/N K10-1020-F | | | |

Figure 2:
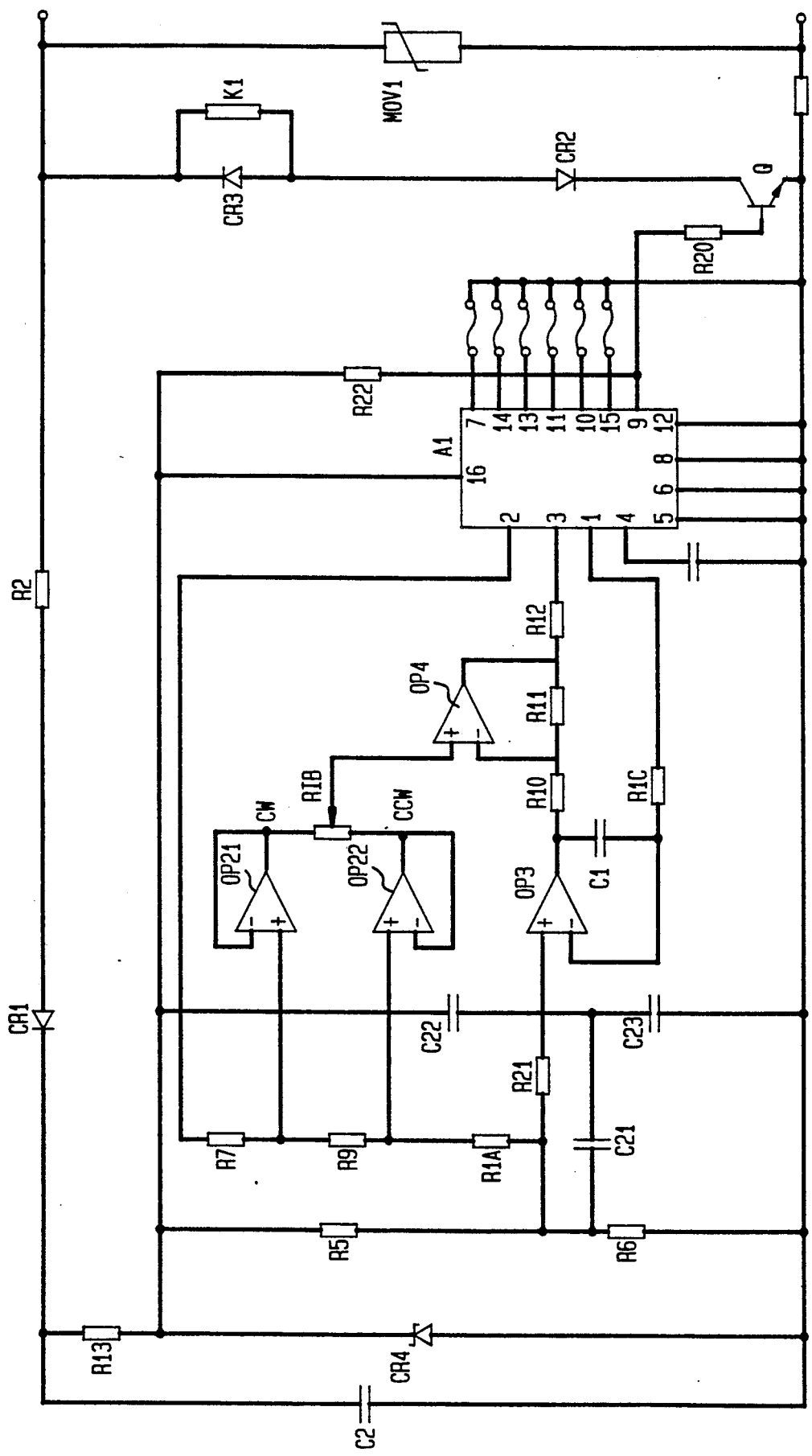
FIGS. 2 and 3 are schematic diagrams similar to FIG. 1 with modifications in the oscillator circuit.

FIG. 2 shows another schematic of a time delay circuit, wherein the components having the same function as in FIG. 1 are labeled with the same reference characters. In this modified circuit, timer IC A1 and operational amplifiers OP3 and OP4 are connected in essentially the same way as in FIG. 1. The timer IC A1 may be one of the Potter & Brumfield timer IC's identified above. However, instead of OP1 and OP2, there are provided operational amplifiers OP21 and OP22 serving as voltage followers which are connected between a junction between R9 and R7 and a junction between R9 and R1A, respectively. The outputs of OP21 and OP22 are connected to the clockwise and counterclockwise ends, respectively, of the potentiometer R1B. The junction of R5 and R6 is tied to the non-inverting input of OP3 through a parallel connection of a resistor R21 and a capacitor C21. Further, the non-inverting input of OP3 is coupled to both the positive and negative power supply voltages of the time delay circuit through capacitors C22 and C23, respectively. Resistors R5 and R6 form the "reference divider" for the reference voltage for integrator OP3. Capacitors C22 and C23 only serve to make the non-inverting node of OP3 more electrically stable against transients. Capacitor C21, together with resistor R21, introduces a "scale compression" phenomenon, whereby, at the higher frequency extremes of the oscillator, which is as a result of the pot being positioned close the CCW end of rotation, the peak-to-peak voltage across R21 (which is due to the current through R7, R9, and R1A) is reduced because capacitor C21 cannot fully stabilize on each and every half-cycle of the oscillator, due to the equivalent "RC" dictated by the source impedance charging C21. The net effect is that the voltage at the CCW end of the pot (R1B) is reduced, raising the oscillator frequency.

Figure 3:
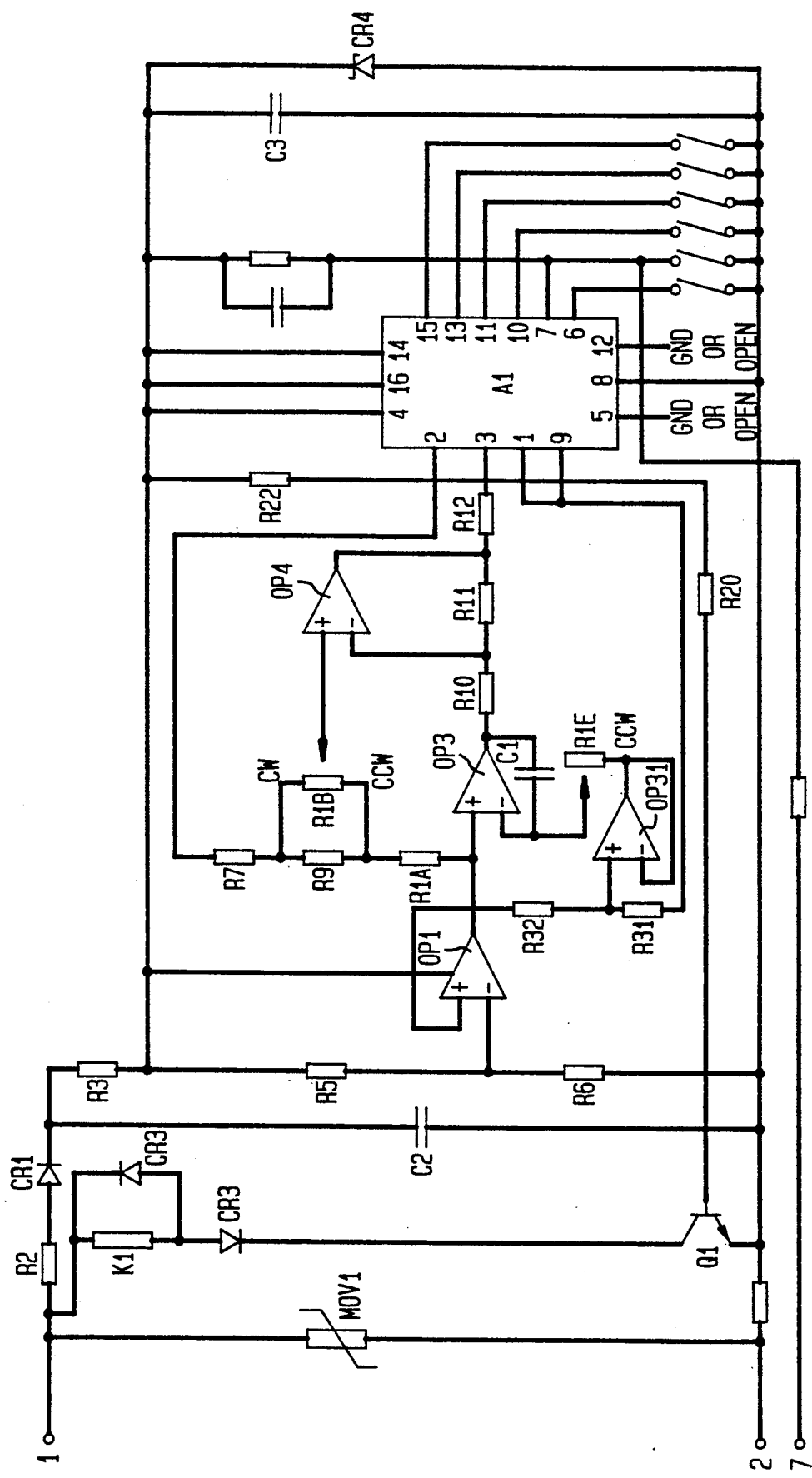
Figure 4:
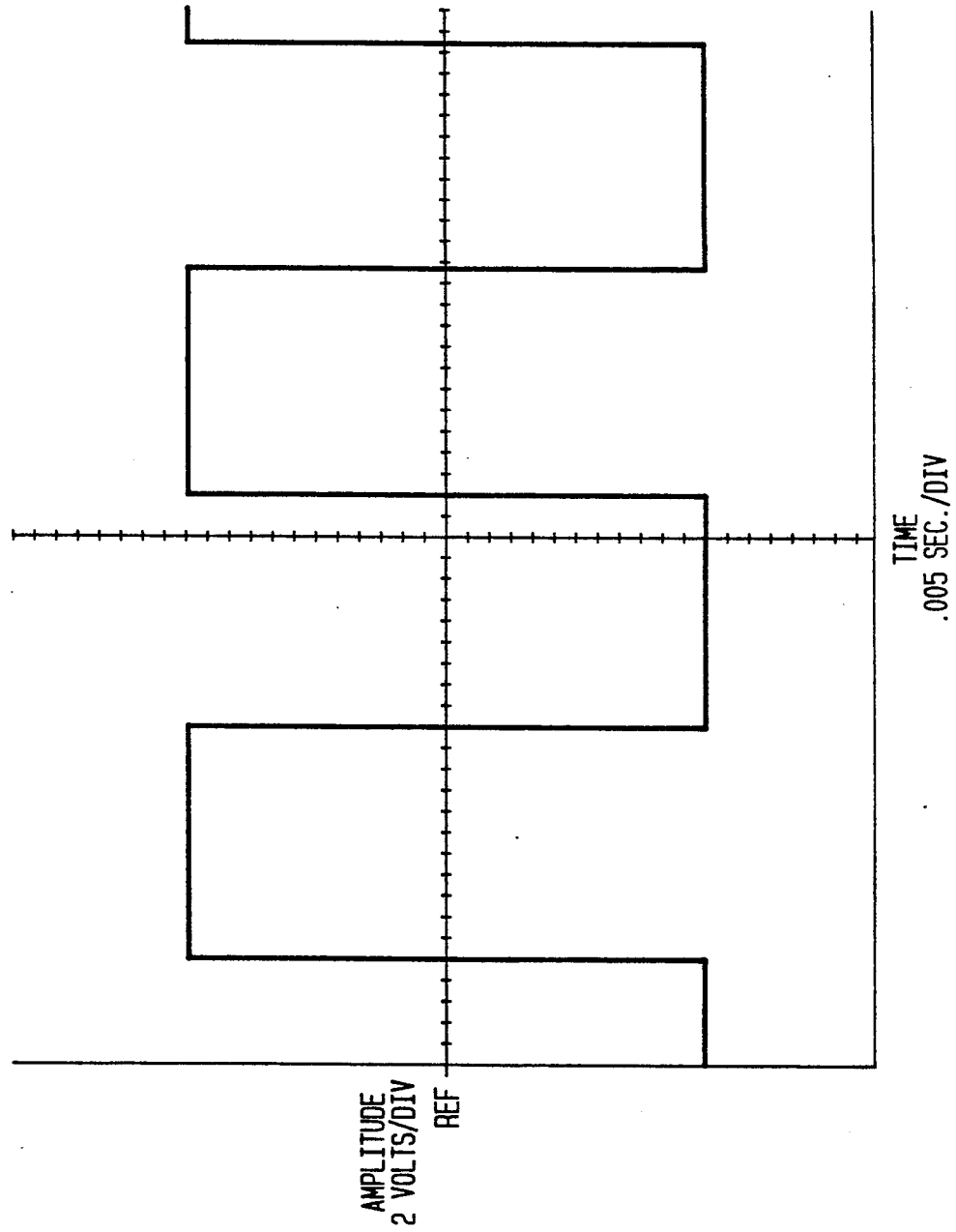
Figure 5:
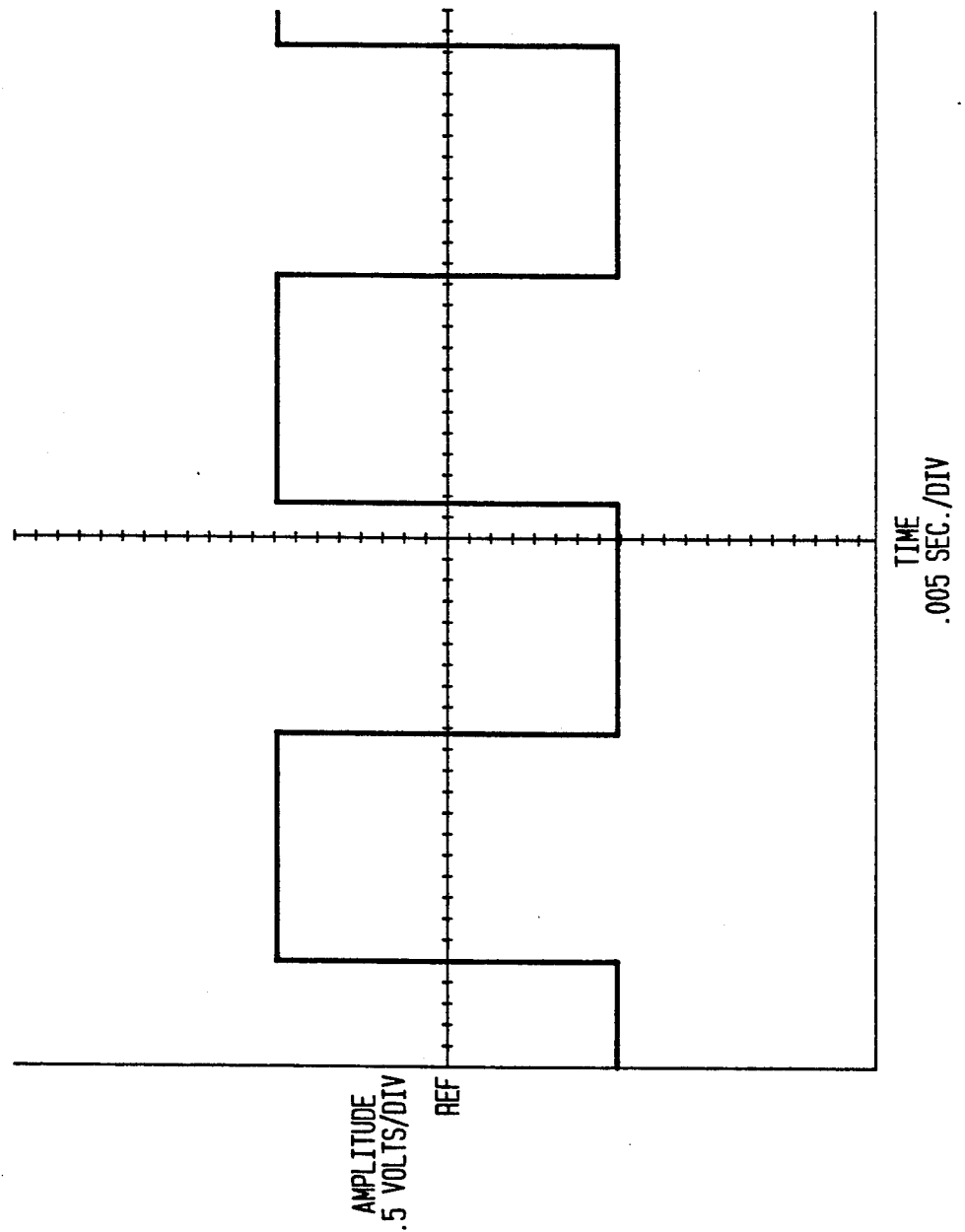
Figure 6:
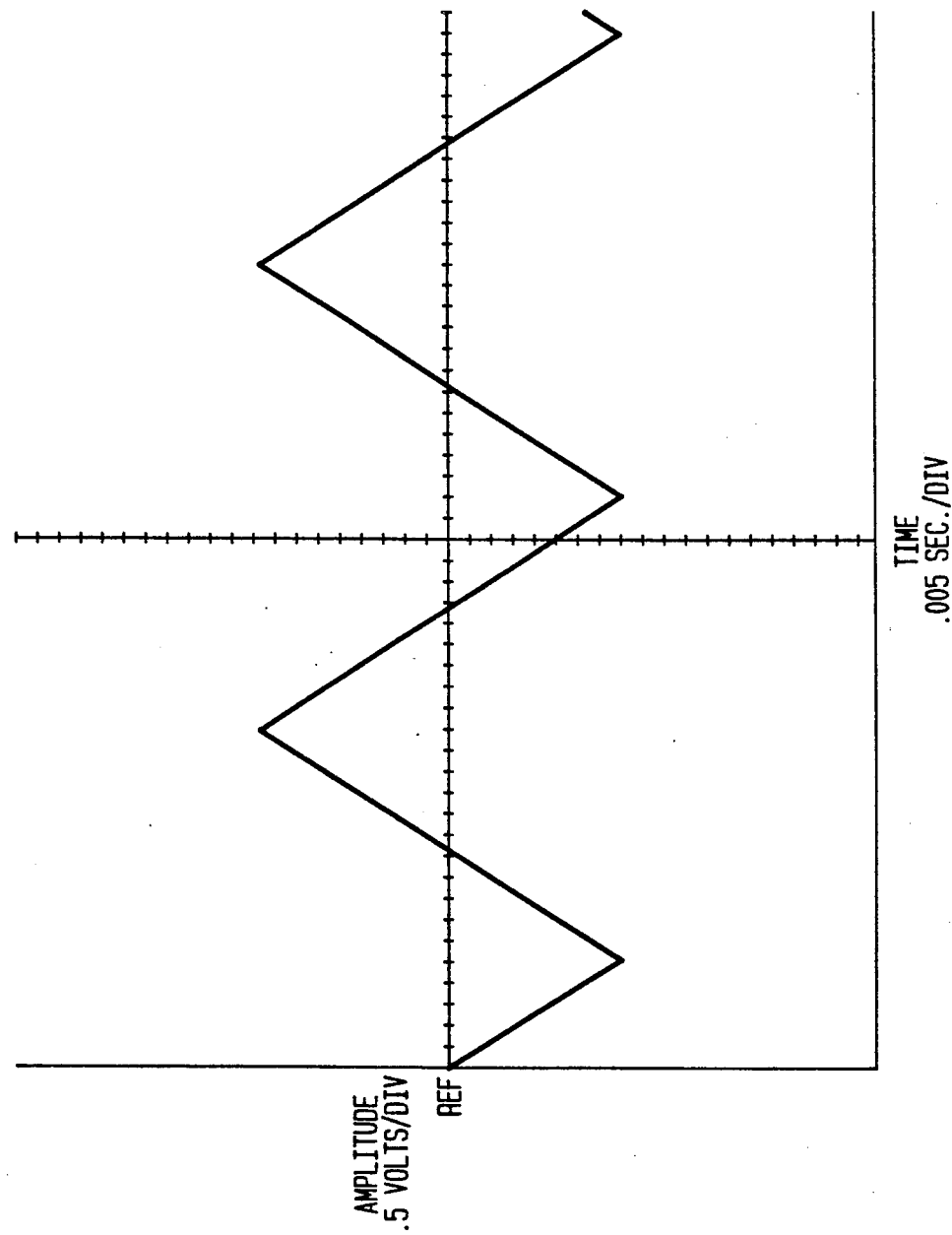
Figure 7:
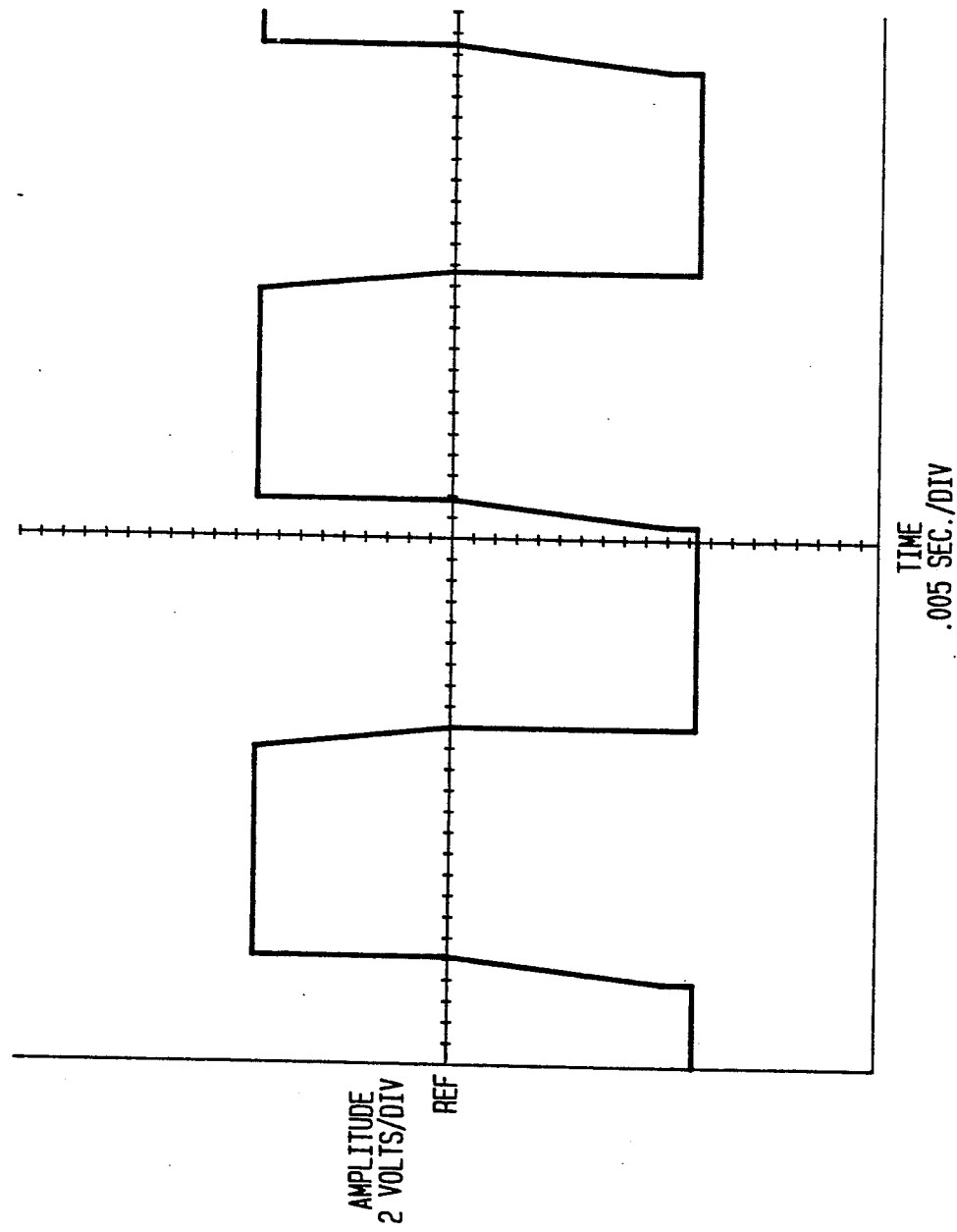
Figure 8:
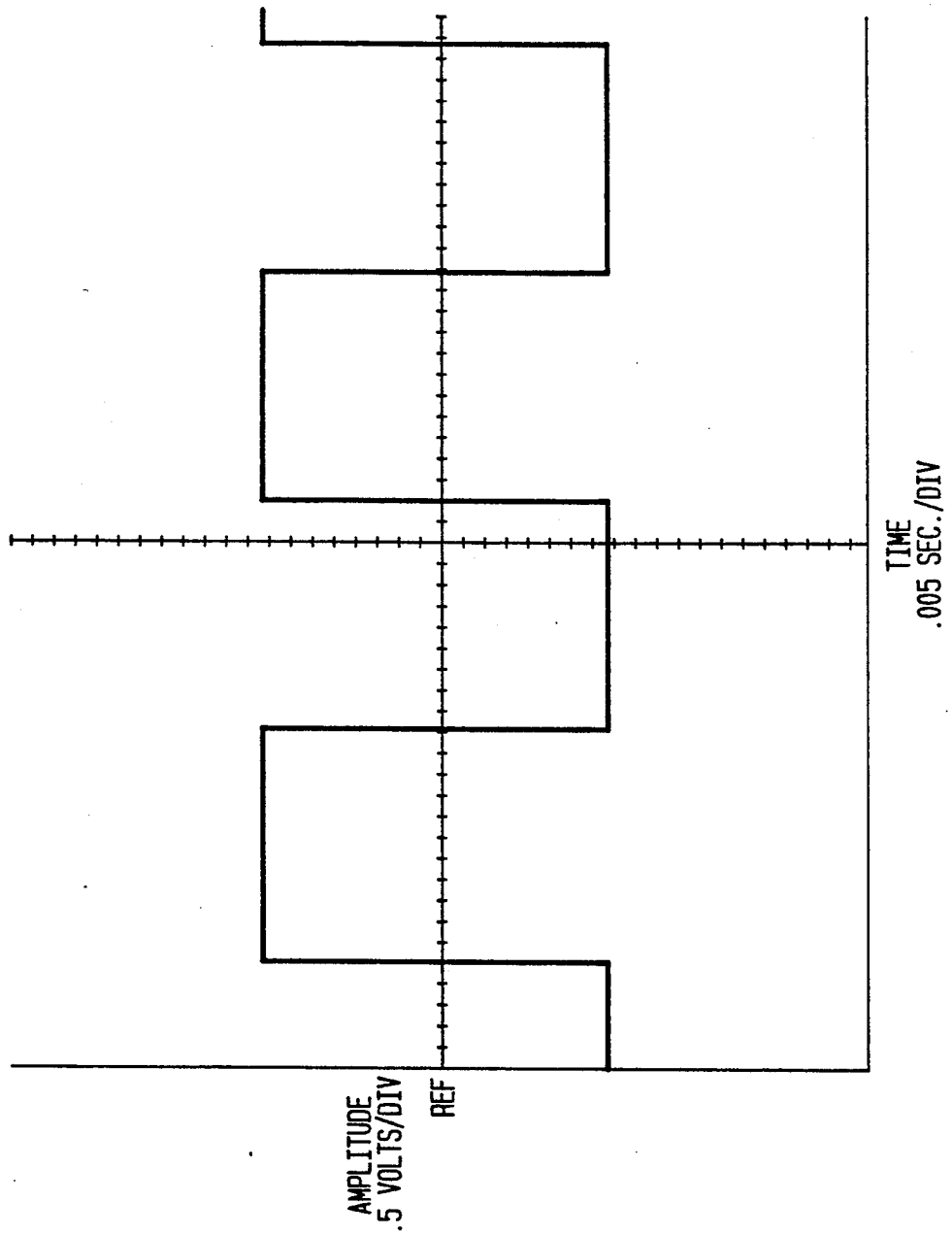
Figure 9:
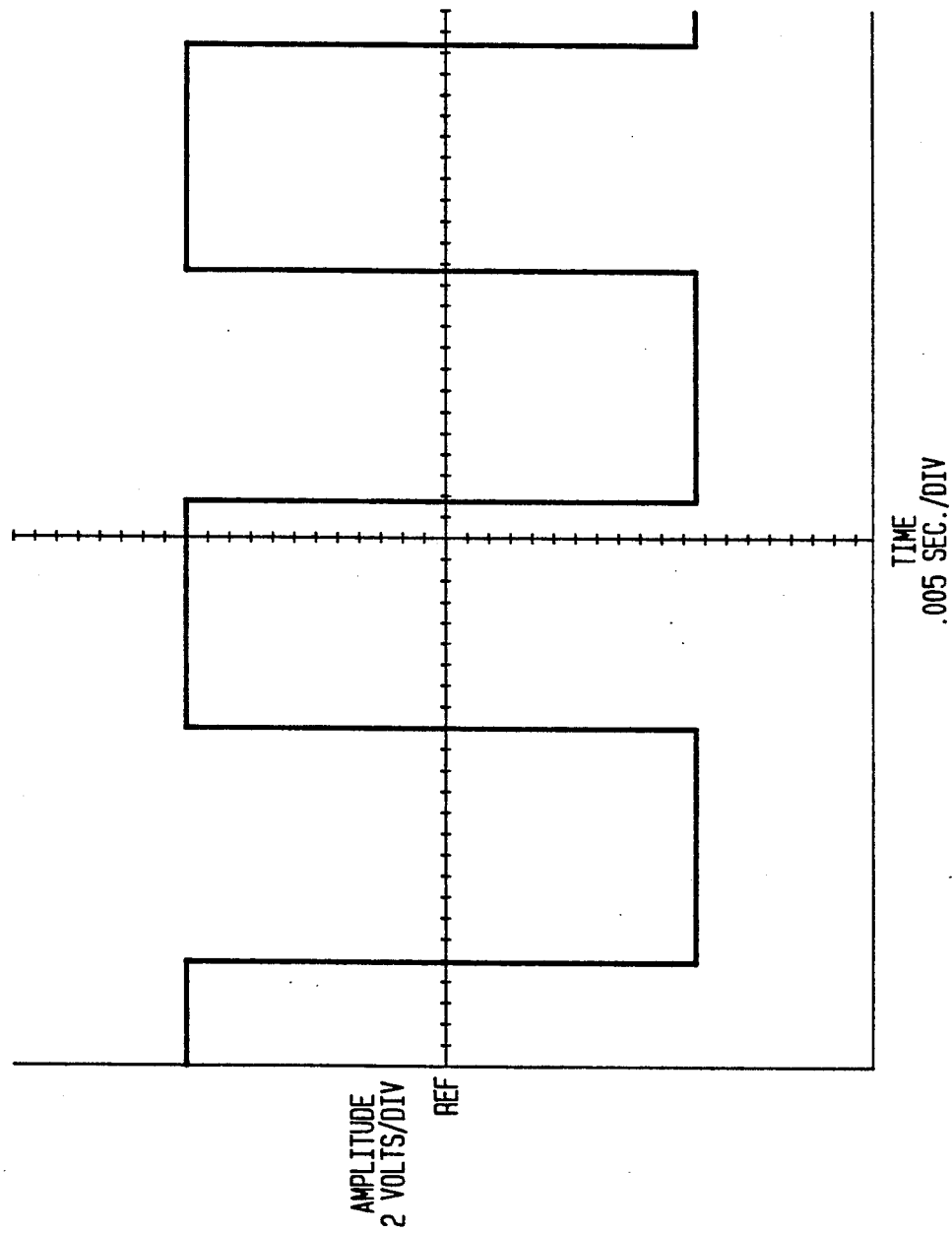
Figure 10:
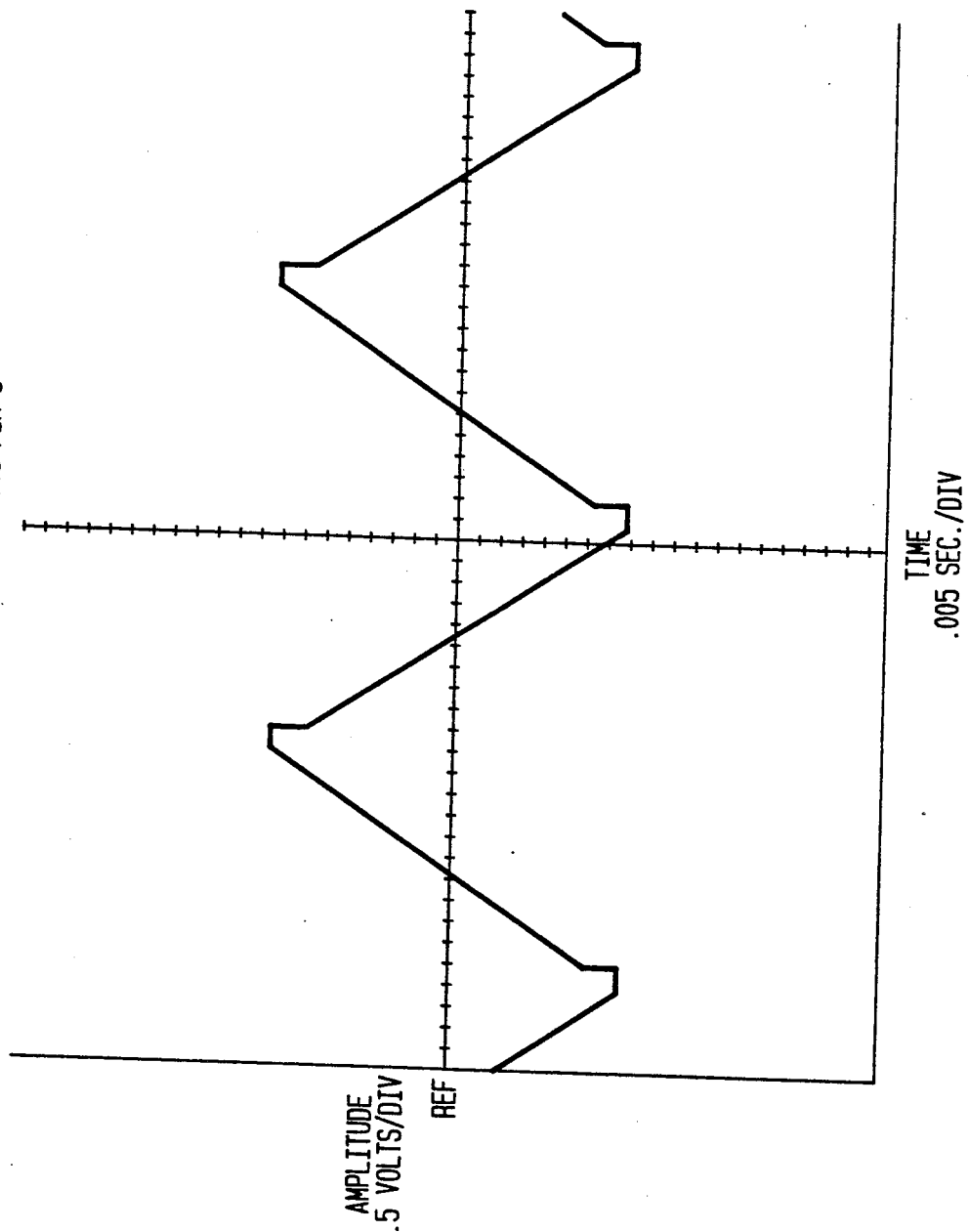
Figure 11:
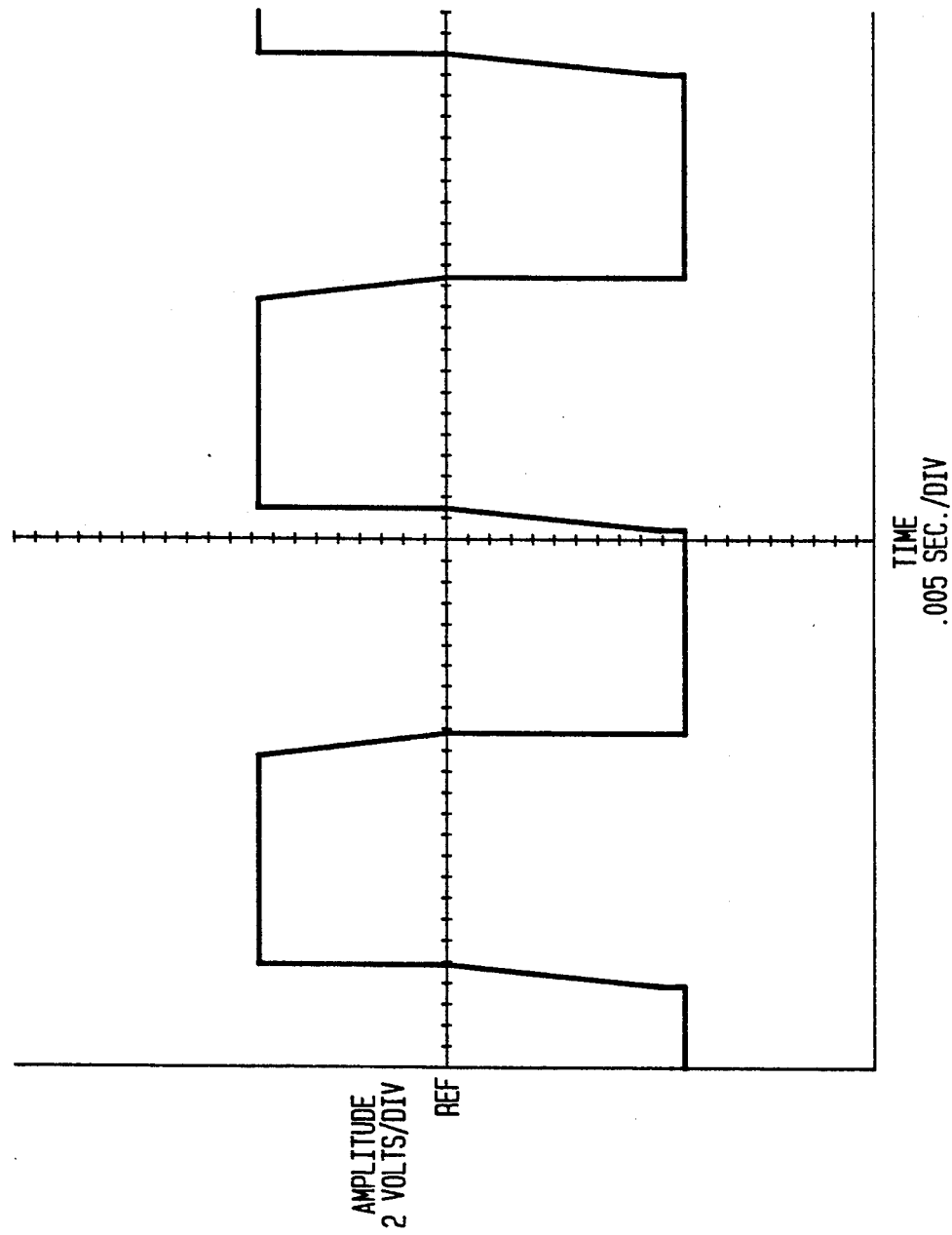

FIG. 3 shows a third schematic similar to FIGS. 1 and 2. One of the Potter & Brumfield timer IC's noted above may be used in FIG. 3. In this circuit variation, most of the same principles apply as those used in the circuit of FIG. 1, with a few minor variations. The variable resistance element in this circuit is "R1E", and it could either be a digitally set potentiometer, or "R1E" could be an external resistor, or any other device having fixed or variable resistance characteristics which could be remotely located with respect to the rest of the electronic circuit. In that particular situation, any noise induced on the (potentially long) lines to the external resistor would be averaged by the integrator, and therefore substantially cancelled, since noise if "AC" in nature. However, in the case of a remotely located external resistor, the series RC network connected from the inverting input to then on-inverting input of the integrator operational amplifier stage OP3 would probably be needed for best noise immunity.

In this particular implementation, the resistor or potentiometer marked R1E is actually the timing resistor for the integrator, but R1B and its associated voltage divider resistors can scale the target voltage for the integrator stage OP3 such that any tolerance variations of the timing capacities C1 can be cancelled, or a particular time or oscillator period can be assigned from a particular resistance without resorting to a change in capacitance.

The purpose of the voltage divider made up of R31 and R32 is to reduce the voltage impressed across R1E. The purpose of this is to reduce power supply current for a very low value of resistance in R1E. Obviously, the two divider networks (the first, composed of R1A, R1B, R7 and R9) and the second (composed of R31 and R32) could swap positions in the schematic and achieve essentially the same result.

Although the voltage applied to the timing resistor R1E can be substantially reduced in this circuit, as compared the voltage applied to the timing resistor in the circuit of FIG. 1, that does not reduce the output voltage from the output of the integrator stage. It only dictates the slew rate of the output of the integrator stage OP3. Since the same constraints apply to the slew rate in this circuit as those that apply to the previously described circuit, the amplification factor dictated by the values of R10 and R11 must still result in a slew rate of less than that of the operational amplifier's maximum slew capability, or phase errors will result as in the previous circuit.

I claim:

1. An adjustable time delay circuit including a voltage controlled oscillator circuit for actuating a counter chain which counts a preselected number of oscillator cycles and produces an output change of state after the counter chain has filled up, said oscillator circuit comprising:

an input;
first and second output signals swinging to positive and negative amplitudes of a given supply voltage with respect to a ground signal, the second output signal being the inverse of the first output signal;
a voltage divider having a potentiometer end and a resistor end, comprising at least a potentiometer and a fixed series resistor, the potentiometer end of the voltage divider being connected to a reference voltage corresponding to said first oscillator output voltage and the resistor end of the voltage divider being connected to said signal ground, a wiper of said potentiometer providing a target voltage corresponding to the actual position of the wiper in the voltage divider;
an integrator stage integrating said second output signal to provide a ramp voltage signal; and
a comparator stage, said target voltage and said ramp voltage signal being fed to the inverting and non-inverting inputs of said comparator stage, the output of the comparator stage delivering a transition signal to said oscillator input when said ramp voltage has a predetermined relationship to the target voltage, resulting in reversal of the amplitudes of the first and second oscillator outputs.

2. The time delay circuit of claim 1, wherein a fixed resistor is connected in parallel across said potentiometer in said voltage divider.

3. The time delay circuit of claim 1, wherein said reference voltage is provided by a second voltage divider reducing the amplitude of said first oscillator output voltage.

4. The time delay circuit of claim 1, wherein said integrator stage comprises an operational amplifier, the non-inverting input of which is connected to said ground signal, a timing resistor connected with its first end to said second output signal and with its second end connected to one end of a timing capacitor, the other end of the capacitor being connected to the output of the operational amplifier and the junction of the capacitor and the resistor being connected to the inverting input of the operational amplifier.

5. The time delay circuit of claim 4, wherein the inverting and non-inverting inputs of the integrator stage operational amplifier are connected through a series connection of a resistor and a capacitor.

6. The time delay circuit of claim 1, wherein said comparator comprises an operational amplifier, the non-inverting input of which receives the target voltage, the inverting input of which receives the ramp voltage signal from said integrator stage through a resistor, and the output of which is fed to the input through a resistor.

7. The time delay circuit of claim 1, wherein said ground signal is derived from a two-rail power supply through a voltage divider and an operational amplifier functioning as a voltage follower.

8. The time delay circuit of claim 4, wherein the timing resistor of the integrator stage is a variable resistance element.

9. The time delay circuit of claim 8, wherein the second output signal is connected to the integrator stage through a voltage divider in order to reduce the voltage imposed across the variable resistance element.

10. The time delay circuit of claim 4, wherein said timing resistor is a variable resistance element.

11. The time delay circuit of claim 4, wherein said timing resistor is composed of a first fixed value resistor and a second fixed value resistor connectable in parallel across said first resistor.

12. The time delay circuit of claim 10, wherein said timing resistor is a digitally set potentiometer.

13. The time delay circuit of claim 10, wherein said timing resistor is a remotely located external resistor.

14. The time delay circuit of claim 2, wherein both ends of the parallel resistor and the potentiometer, respectively, are each connected to a voltage follower operational amplifier.

15. A time delay relay comprising:

a relay; and
a time delay circuit including a voltage controlled oscillator circuit for actuating a counter chain which counts a preselected number of oscillator cycles and produces an output change of state after the counter chain has filled up, said oscillator circuit comprising:

an input;
first and second output signals swinging to positive and negative amplitudes of a given supply voltage with respect to a ground signal, the second output signal being the inverse of the first output signal;
a voltage divider having a potentiometer end and a resistor end, comprising at least a potentiometer and a fixed series resistor, the potentiometer end of the voltage divider being connected to a reference voltage corresponding to said first oscillator output voltage and the resistor end of the voltage divider being connected to said signal ground, a wiper of said potentiometer providing a target voltage corresponding to the actual position of the wiper in the voltage divider;
an integrator stage integrating said second output signal to provide a ramp voltage signal; and
a comparator stage, said target voltage and said ramp voltage signal being fed to the inverting and non-inverting inputs of said comparator stage, the output of the comparator stage delivering a transition signal to said oscillator input when said ramp voltage has a predetermined relationship to the target voltage, resulting in reversal of the amplitudes of the first and second oscillator outputs, wherein said relay is controlled by the output signal of said time delay circuit so as to switch on and off said relay in accordance with a time period preset in said time delay circuit.

16. An oscillator circuit, comprising:

a means for producing a ground voltage;
a means for producing first and second output signals, the magnitudes of both of the first and second output signals alternating between first and second voltages levels above and below the ground signal, the second output voltage being the inverse of the first output voltage;
a means responsive to the first output signal for producing a reference signal;

a frequency setting element responsive to the ground voltage and the reference signal for producing a target voltage;
a means for integrating the second output signal and producing a ramp signal; and
a means for comparing the ramp signal with the target voltage and producing a transition signal when the magnitude of the ramp signal has a predetermined relationship to the magnitude of the target voltage, the alternating of the first and second output signals being responsive to the transition signal.

* * * * *